(12) United States Patent
Xing et al.

(10) Patent No.: US 7,534,112 B2
(45) Date of Patent: May 19, 2009

(54) SOCKET CONNECTOR

(75) Inventors: Zhi-Gang Xing, ShenZhen (CN);
Qing-Feng Wang, ShenZhen (CN)

(73) Assignee: Hon Hai Precision Ind. Co., Ltd.,
Taipei Hsien (TW)

( * ) Notice: Subject to any disclaimer, the term of this patent is extended or adjusted under 35 U.S.C. 154(b) by 0 days.

(21) Appl. No.: 11/974,573

(22) Filed: Oct. 15, 2007

(65) Prior Publication Data

US 2008/0090428 A1    Apr. 17, 2008

(51) Int. Cl.
*H01R 13/62* (2006.01)

(52) U.S. Cl. .......................... 439/73; 439/331
(58) Field of Classification Search .............. 439/73, 439/331, 525, 526
See application file for complete search history.

(56) References Cited

U.S. PATENT DOCUMENTS

| | | | | |
|---|---|---|---|---|
| 6,585,535 B2 * | 7/2003 | Murr et al. | ................... | 439/331 |
| 6,685,494 B1 * | 2/2004 | McHugh et al. | .............. | 439/342 |
| 6,971,902 B2 * | 12/2005 | Taylor et al. | ................ | 439/342 |
| 7,112,068 B2 * | 9/2006 | Ma | .............................. | 439/71 |
| 7,189,093 B2 * | 3/2007 | Ma | .............................. | 439/331 |
| 7,217,149 B2 * | 5/2007 | Ma | .............................. | 439/331 |
| 2005/0121488 A1 * | 6/2005 | Sun | ............................. | 227/109 |
| 2005/0124188 A1 * | 6/2005 | Ma | .............................. | 439/73 |
| 2006/0141840 A1 * | 6/2006 | Ma | ............................. | 439/331 |

* cited by examiner

*Primary Examiner*—Gary F. Paumen
(74) *Attorney, Agent, or Firm*—Wei Te Chung

(57) ABSTRACT

A socket connector (1) for electrically connecting an integrated circuit package to a printed circuit board comprises a stiffener (3) including a base plate, an opening defined in a approximate central area of the base plate, a plurality of grooves (30) defined in the base plate and not communicated with the opening, an socket body (2) assembled in the opening of the stiffener, a plurality of latches (22) extending from the socket body and received in the grooves of the base plate, the edge of the socket body distant to the edge of the opening of the stiffener, a plurality of terminals received in the socket body.

20 Claims, 5 Drawing Sheets

SOCKET CONNECTOR

BACKGROUND OF THE INVENTION

1. Field of the Invention

The present invention generally relates to the art of socket connectors and, more particularly, to a land grid array (LGA) socket to provide electrical connection between an LGA package and an electrical substrate, such as a printed circuit board (PCB).

2. Background of the Invention

Integrated circuit packages are generally classified as pin grid array (PGA) packages, ball grid array (BGA) packages and land grid array (LGA) packages depending on the shape of contacting section of the terminals. An integrated circuit package with conductive pads arranged on a bottom surface thereof in a land grid array is known as an LGA package.

Socket connectors for removably connecting an LGA package with a PCB are known as LGA sockets. Basically, an LGA socket includes a socket body and a plurality of terminals embedded in the socket body, a stiffener surrounding to the socket body, a load plate pivotably assembled on one end of the stiffener and a load lever pivotably attached to the other end of the stiffener. The stiffener is made of metal material, and the socket body is made of plastic material, the stiffener and the socket is linked by interference engagement. Each terminal has a contacting section and an opposite connecting section. Under compression, the contacting section of the terminal is resiliently deflected from its natural state and electrically registered with a conductive pad on the LGA package. The socket connector is mounted on the PCB, the LGA package is assembled on the upper surface of the socket body, then pressing the load plate on the LGA package and rotating the load lever for pressing the load plate on the LGA package. Thus, a flow of electrical signals is established between the LGA package and the PCB by the terminals in the socket body.

U.S. Pat. No. 7,189,093 issued to Hao-Yun Ma on Mar. 13, 2007 discloses a conventional socket connector. As the socket body and the stiffener is connected by interference engagement, the remand for dimension tolerance of the socket body and the stiffener is very high and it is not easy to control the interference engagement length between the socket body and the stiffener, the socket body will mismatch with the stiffener in this typical socket connector and connection between the socket body and the stiffener is unstable.

TW M279049 discloses another socket connector. The socket body defines a latch extending downward from the bottom surface of the socket body, the inner edges of the stiffener define a plurality of grooves for receiving the latch so that the socket body can be connected with the stiffener. However, the sidewalls of the socket body are adjacent to the inner edges of the stiffener, the swell factor of the socket body is bigger than that of the stiffener, so the socket body will be distortion as the socket body presses the stiffener when the socket connector is heated, then the connection between the LGA package and the PCB will be unstable.

Therefore, there is a heretofore-unaddressed need in the industry to address the aforementioned deficiencies and inadequacies.

SUMMARY OF THE INVENTION

Accordingly, a primary object of the present invention is to provide a socket connector having a housing and a stiffener body attached to each other compactly.

According to preferred embodiment of the invention, a socket connector for electrically connecting an integrated circuit package to a printed circuit board comprises a stiffener including a base plate, an opening defined in a approximate central area of the base plate, a plurality of grooves defined in the base plate and not communicated with the opening, an socket body assembled in the opening of the stiffener, a plurality of latches extending from the socket body and received in the grooves of the base plate, a plurality of terminals received in the socket body.

The present invention has several advantages as below: as the latches extends outward from the socket body, the stiffener defines a plurality of grooves for receiving the latches, the groove of the stiffener is not communicated with the opening of the stiffener and the edge of the socket body is distant to the edge of the opening of the stiffener, the distortion of the socket body for the difference of the dimension tolerance between the socket and the stiffener can be prevented.

Other features and advantages of the present invention will become more apparent to those skilled in the art upon examination of the following drawings and detailed description of preferred embodiment, in which:

DETAILED DESCRIPTION OF THE PREFERRED EMBODIMENT

Figure 1:
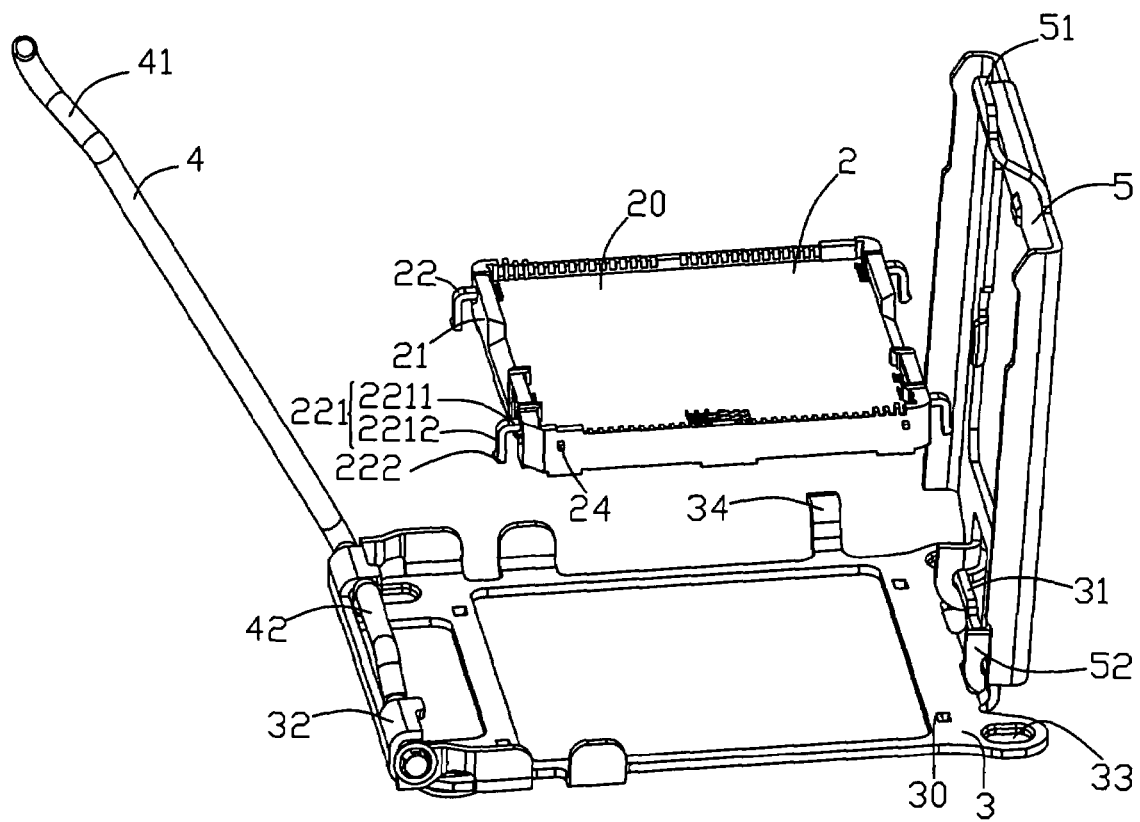
FIG. 1 depicts an isometric view of an LGA socket in accordance with a preferred embodiment of the present invention, wherein the socket body of the socket connector is not assembled in the stiffener.
Figure 2:
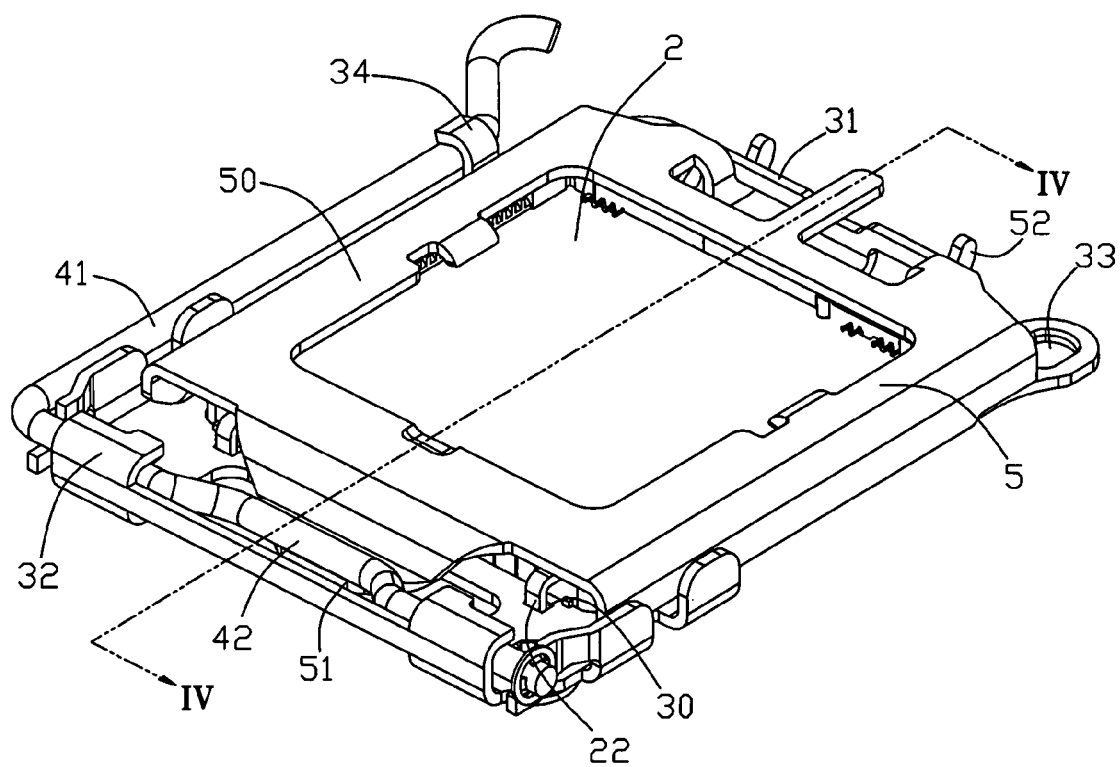
FIG. 2 depicts an assembled, isometric view of the socket connector.
Figure 3:
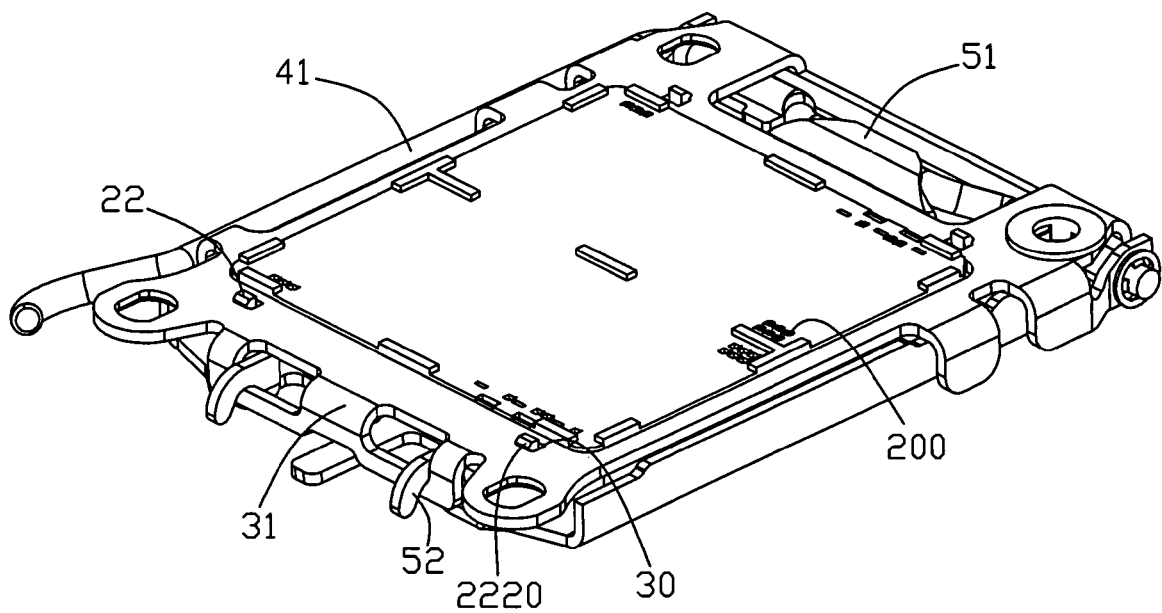
FIG. 3 depicts a bottom view of the socket connector of FIG. 2.
Figure 4:
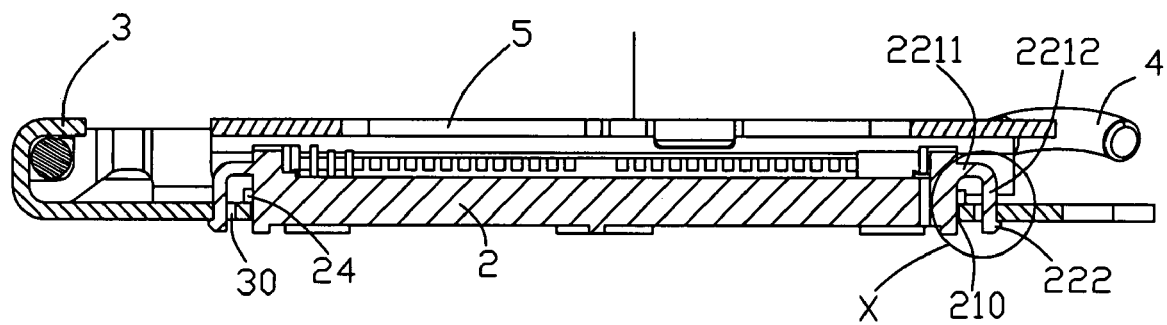
FIG. 4 depicts a cross-section view taken along line IV-IV of FIG. 2.

Reference will now be made to describe the preferred embodiment of the present invention in detail. As shown in FIGS. 1-4, a socket connector 1 in accord with a preferred embodiment of the present invention is used to establish electrical connection between an LGA package (not shown) and an electrical substrate, such as a PCB (not shown). The socket connector 1 includes a socket body 2 embedded with a plurality of terminals (not shown). A stiffener 3 is surrounding to the socket body 2. A load plate 5 is pivotally mounted on one end of the stiffener 3. A load lever 4 is pivotally supported on an opposite end of the stiffener 3.

Figure 5:
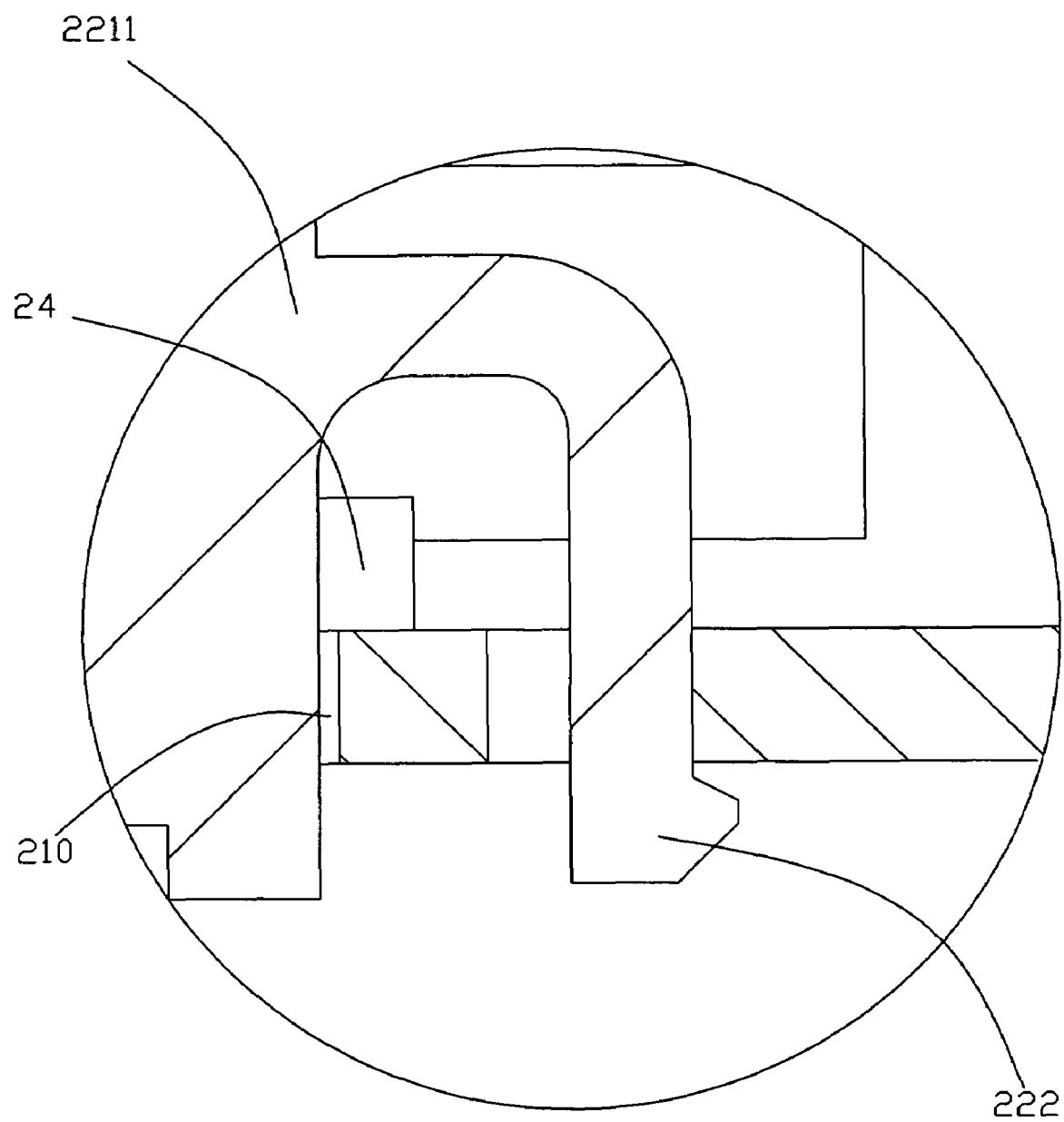
FIG. 5 is an enlarged and encircled view of the X portion from FIG. 4.

Individual elements of the socket connector 1 will now be described in greater detail. The socket body 2 is molded from resin or the like and is shaped in the form of a rectangular frame. A top section of the socket body 2 has an electrical area 20 that is defined by straight peripheral sidewalls 21. The electrical area 20 includes a supporting surface 201 and a mounting surface 202 opposite to the supporting surface 201. A plurality of passageways 200 for receiving the terminals (not shown) is defined in a matrix pattern throughout the supporting surface 201 and the mounting surface 202. A plurality of latches 22 extends outward from the socket body 2 and comprises a cantilever 221 and a latching portion 222. The cantilever 221 has an invert L-shape and comprises a connecting portion 2211 extending from the sidewall 21 and an extending portion 2212 perpendicular to the connection portion 2212. The latching portion 222 faces away from the sidewall 21 of the socket body 2 and it locks the bottom portion of the stiffener 3 for connecting the socket body 2 and the stiffener 3. The lower end of the latching portion 22 defines an inclined surface 2220. The mounting surface 202 of the socket body 2 defines a plurality of standoffs 2020, and the standoff 2020 is lower than the latch 22 in the vertical direction. The outer wall of the socket body 2 is provided with supporting blocks 24 such that the socket body 2 can properly sit onto the stiffener 3. The distance between the supporting block 24 and the latching portion 2211 can be specially selected such that it is substantially larger than the thickness of the thickness of the stiffener 3, see FIG. 5. As a result, this arrangement makes the socket body 2 be slightly floatable with respect to stiffener 3.

Each terminal includes a contacting section (not shown) to be resiliently and electrically mated with a conductive pad on the LGA package and an opposite soldering section (not shown) to be connected to a circuit pad arranged on the PCB.

The stiffener 3 is formed by stamping and bending a single sheet of metal into a rectangular plate. The stiffener 3 defines a base plate (not shown) and an opening (not shown) is defined in an approximate central area of the base plate. Two longitudinal opposite ends of the stiffener 3 define a pivotal portion 31 for assembling the load plate 5 and a receiving portion 32 for assembling the load lever 32. The stiffener 3 defines a plurality of grooves 30 for receiving the latches 22. The edge of the opening in the stiffener 3 is not communicated with the opening and is distant to the sidewall 21 of the socket body 2. The base plate defines four through-holes 33 at four corners of the base plate and the through-holes 33 is used for assembling the stiffener 3 on the PCB cooperation with fastening equipment, such as screw. The side of the stiffener 3 adjacent to the pivotal portion 31 and the receiving portion 32 defines a fixing portion 34 extending upward from the edge thereof for fixing the load plate 5 on the socket body 2.

The load plate 5 is formed by stamping and bending a single sheet of metal into a rectangular shape. The load plate 5 includes a main portion 50 for covering on the upward side of the LGA package. One end of the main portion 50 defines a interlocking element 51 for engaging with the load lever 4 and the other end of the main portion 50 defines a pair of bearing tongues 52. The bearing tongue 52 are curved downward and spaced apart from one another. A holding element 55 is provided midway between the bearing tongues 52.

The load lever 4 is formed by bending a single metallic wire and includes a single metallic wire and includes a pair of rotary shafts 420 which are spaced apart from one another. A locking section 42 is disposed between the rotary shafts 420 and is displaced relative to the rotary shafts 420. An actuating section 41 for rotating the rotary shafts 420 is bent at a right angle with respect to the rotary shafts 420 and fixed on the interlocking element 51 for holding the LGA package on the upper supporting surface 201 stably. A distal end of the actuating section 41 is formed into a U-like shape in order to form a handle for ease of actuation and is locked on the fixing portion 34 of the stiffener 3.

In assembly, the socket body 2 is engaged with the stiffener 50 by the connection between the latches 22 and the grooves 30, then, the extending portion 2212 of the latch 22 is received in the groove 30 and the latching portion 222 is fixed on the below surface of the stiffener. The load plate 5 and the load lever 4 is pivotally mounted on the pivotal portion 31 and the receiving portion 32 of the stiffener 3. The socket connector 1 is positioned on the PCB and the LGA package is mounted on the supporting surface 201 of the socket body 2, rotating the load plate 5 in the closed position where the main portion 50 of the load plate 5 covers on the LGA package, then, the load lever is rotated to an position where the load lever 4 is latched on the fixing portion 34 of the stiffener 3 so that the connection between the LGA package and the PCB. The socket body 2 is connected with the stiffener 3 by the latches 22 extending from the socket body 2 receiving in the groove 30 of the stiffener 3, the groove 30 is not communicated with the opening of the stiffener 3 and there is a gap 210 between the sidewall 21 of the socket body 2 and the edge of the opening of the stiffener 3, so the distortion of the socket body for the difference of the dimension tolerance between the socket and the stiffener can be prevented.

While the present invention has been described with reference to a specific embodiment, the description of the invention is illustrative and is not to be construed as limiting the invention. Various of modifications to the present invention can be made to the preferred embodiment by those skilled in the art without departing from the true spirit and scope of the invention as defined by the appended claims.

What is claimed is:

1. A socket connector for electrically connecting an integrated circuit package to a printed circuit board comprising:
   a stiffener including a base plate, the base plate defining a central opening and a plurality of grooves separated from the opening;
   a socket body assembled in the opening of the stiffener, a plurality of latches extending from the socket body and received and retained in the grooves of the base plate, the base plate and the socket body defining a gap at periphery of the socket body; and
   a plurality of terminals received in the socket body.

2. The socket connector as described in claim 1, further comprising a load plate and a load lever pivotally mounted on the stiffener.

3. The socket connector as described in claim 2, wherein the load plate and the load lever are pivotally mounted on two ends of the stiffener, respectively.

4. The socket connector as described in claim 3, wherein the latch comprises a cantilever extending outwardly and downwardly from a top end of the socket body and a latching portion extending from the cantilever.

5. The socket connector as described in claim 4, wherein the socket body defines a plurality of sidewalls and the sidewalls of the socket body are distant to the opening.

6. The socket connector as described in claim 5, wherein each latch extends from the sidewall of the socket body and the latching portion is back against the sidewall of the socket body.

7. The socket connector as described in claim 6, wherein the latching portion defines an inclined surface adapted to assemble in the groove of the base plate expediently.

8. The socket connector as described in claim 4, wherein the socket body defines a plurality of standoffs at lower surface thereof, and the standoffs are lower than the latches in the vertical direction.

9. The socket connector as described in claim 8, wherein the base plate defines four through-holes at four corners thereof.

10. The socket connector as recited in claim 1, wherein the socket body is provided with a plurality of supporting block at the periphery thereof for sitting on the base plate of the stiffener.

11. The socket connector as recited in claim 10, wherein the supporting block is located between the sidewall and the latch of the socket body.

12. A socket connector assembly comprising:
an insulative housing defining a periphery;
a plurality of contacts disposed in the housing; and
a metallic stiffener surrounding said housing and defining a plurality of retention sections around the corners for allowing screws extending therethrough to fasten the stiffener to a printed circuit board; wherein
the housing is equipped with a resilient latch around said periphery so as to allow said housing to be assembled to the stiffener in one vertical direction while preventing said housing from leaving said stiffener in an opposite vertical direction via a hook of said resilient latch engaged with the stiffener in said opposite vertical direction, and said housing is somewhat vertically floating relative to the stiffener.

13. The socket connector assembly as claimed in claim 12, wherein the housing is further equipped with a supporting block against which the stiffener can abut so as to restrict assembling of the housing to the stiffener in said one vertical direction.

14. The socket connector assembly as claimed in claim 13, wherein said supporting block is discrete from the resilient latch.

15. The socket connector assembly as claimed in claim 12, wherein said stiffener defines a groove to receive said resilient latch.

16. The socket connector assembly as claimed in claim 12, wherein said housing is assembled to the stiffener downwardly.

17. The socket connector assembly as claimed in claim 13, wherein said housing is somewhat vertically floating relative to the stiffener between the hook of the resilient latch and the supporting block in the vertical direction.

18. A socket connector assembly comprising:
an insulative housing defining a periphery;
a plurality of contacts disposed in the housing; and
a metallic stiffener surrounding said housing and defining a plurality of retention sections around the corners for allowing screws extending therethrough to fasten the stiffener to a printed circuit board; wherein
the housing is equipped with a resilient latch around said periphery so as to allow said housing to be assembled to the stiffener in one vertical direction while preventing said housing from leaving said stiffener in an opposite vertical direction via a hook of said resilient latch engaged with the stiffener in said opposite vertical direction; wherein
said latch is of an upside-down L-shaped configuration extending from an exterior side face of the periphery, and the hook is Located at a distal end of the resilient latch and horizontally spaced from said exterior side face with a portion of the stiffener therebetween.

19. The socket connector assembly as claimed in claim 18, wherein the housing is further equipped with a supporting block against which the stiffener can abut so as to restrict assembling of the housing to the stiffener in said one vertical direction.

20. The socket connector assembly as claimed in claim 18, wherein said housing is somewhat vertically floating relative to the stiffener.

* * * * *